United States Patent
Sun et al.

(10) Patent No.: US 7,084,061 B2
(45) Date of Patent: Aug. 1, 2006

(54) METHODS OF FABRICATING A SEMICONDUCTOR DEVICE HAVING MOS TRANSISTOR WITH STRAINED CHANNEL

(75) Inventors: Min-Chul Sun, Busan (KR); Ja-Hum Ku, Seongnam (KR); Sug-Woo Jung, Suwon (KR); Sun-Pil Youn, Seoul (KR); Min-Joo Kim, Seoul (KR); Kwan-Jong Roh, Anyang (KR)

(73) Assignee: Samsung Electronics, Co., Ltd. (KR)

( * ) Notice: Subject to any disclaimer, the term of this patent is extended or adjusted under 35 U.S.C. 154(b) by 194 days.

(21) Appl. No.: 10/799,788

(22) Filed: Mar. 12, 2004

(65) Prior Publication Data

US 2004/0253791 A1 Dec. 16, 2004

(30) Foreign Application Priority Data

Jun. 16, 2003 (KR) ...................... 10-2003-0038889

(51) Int. Cl.
*H01L 21/44* (2006.01)
(52) U.S. Cl. ................ 438/685; 438/682; 257/E21.458
(58) Field of Classification Search ................ 438/682, 438/683, 686, 685; 257/E21.438
See application file for complete search history.

(56) References Cited

U.S. PATENT DOCUMENTS

| | | | | |
|---|---|---|---|---|
| 5,264,724 A | * | 11/1993 | Brown et al. | ................ 257/347 |
| 5,683,934 A | | 11/1997 | Candelaria | .................. 437/134 |
| 6,071,784 A | | 6/2000 | Mehta et al. | ................ 438/303 |
| 6,265,271 B1 | | 7/2001 | Thei et al. | .................. 438/296 |
| 6,358,806 B1 | | 3/2002 | Puchner | ...................... 438/308 |
| 6,656,853 B1 | * | 12/2003 | Ito | .............................. 438/778 |
| 2004/0253776 A1 | * | 12/2004 | Hoffmann et al. | .......... 438/199 |

* cited by examiner

*Primary Examiner*—Bradley K. Smith
(74) *Attorney, Agent, or Firm*—Mills & Onello LLP

(57) ABSTRACT

Methods of fabricating a semiconductor device having a MOS transistor with a strained channel are provided. The method includes forming a MOS transistor at a portion of a semiconductor substrate. The MOS transistor is formed to have source/drain regions spaced apart from each other and a gate electrode located over a channel region between the source/drain regions. A stress layer is formed on the semiconductor substrate having the MOS transistor. The stress layer is then annealed to convert a physical stress of the stress layer into a tensile stress or increase a tensile stress of the stress layer.

27 Claims, 7 Drawing Sheets

METHODS OF FABRICATING A SEMICONDUCTOR DEVICE HAVING MOS TRANSISTOR WITH STRAINED CHANNEL

This application claims the benefit of Korean Patent Application No. 2003-38889, filed Jun. 16, 2003, the contents of which are hereby incorporated herein by reference in their entirety.

BACKGROUND OF THE INVENTION

1. Field of the Invention

The present invention relates to methods of fabricating a semiconductor device and, more particularly, to methods of fabricating a semiconductor device including a metal oxide semiconductor (MOS) transistor with a strained channel.

2. Description of Related Art

MOS transistors are widely employed as switching devices of semiconductor devices. Accordingly, fabrication of high performance MOS transistors is required in order to improve characteristics of the semiconductor devices. A salicide technique is widely used in fabrication of the high performance MOS transistors.

According to the salicide technique, a metal silicide layer is selectively formed on a gate electrode and source/drain region of a MOS transistor. Thus, it can substantially reduce electrical resistivity of the gate electrode and source/drain regions. A cobalt silicide layer or a titanium silicide layer is widely used as the metal silicide layer. In particular, the cobalt silicide layer exhibits low dependence of resistivity on its line width. Accordingly, the cobalt silicide layer has been widely used in fabrication of a gate electrode of a short channel MOS transistor. However, in the event that the gate electrode has a narrow width less than about 0.1 µm, there is a limitation in applying the cobalt silicide layer to the gate electrode because of the phenomenon called "agglomeration". Thus, recently, a nickel salicide technique is widely used in fabrication of high performance MOS transistors.

A nickel silicide layer formed using the nickel salicide technique may have various composition ratios. For example, the nickel silicide layer may be a di-nickel mono-silicide ($Ni_2Si$) layer, a mono-nickel mono-silicide (NiSi) layer, or a mono-nickel di-silicide ($NiSi_2$) layer. The mono-nickel mono-silicide (NiSi) layer has the lowest resistivity out of the various nickel silicide layers. The mono-nickel mono-silicide layer is formed at a low temperature of 350–550° C., whereas the mono-nickel di-silicide layer is formed at a higher temperature than 550° C. Accordingly, the nickel silicide layer should be formed at a low temperature below 550° C. to have a low resistivity.

There is an alternative approach to achieve the high performance MOS transistors. That is, a method of forming a strained channel has been proposed in order to improve performance of the MOS transistors. The strained channel has a greater lattice constant than silicon. Accordingly, mobility of carriers in the strained channel is increased, thereby improving a switching speed of the MOS transistor. The methods of forming the strained channel are taught in U.S. Pat. Nos. 6,358,806 B1 and 5,683,934. According to the U.S. Pat. Nos. 6,358,806 B1 and 5,683,934, the strained channel is formed using a silicon carbide layer and/or an epitaxial growing technique. However, highly precise, accurate and complicated processes are required in order to employ the silicon carbide layer and the epitaxial growing technique.

In the meantime, methods of forming a borderless contact are taught in U.S. Pat. No. 6,265,271 B1 to Thei et al. According to Thei et al., an etch stop layer is formed on an entire surface of a semiconductor substrate having a MOS transistor fabricated using a salicide technique. The substrate having the etch stop layer is annealed to densify the etch stop layer. The annealing process is performed at a temperature within the range of 850–900° C. In this case, the annealing process is performed in order to obtain a phase transformation of cobalt mono-silicide layers or titanium mono-silicide layers formed on the gate electrodes and source/drain regions of the MOS transistors as well as to densify the etch stop layer. The cobalt mono-silicide layer (or the titanium mono-silicide layer) exhibits a relatively high resistivity as compared to a cobalt di-silicide layer (or a titanium di-silicide layer). Thus, the annealing process is performed in order to convert the cobalt mono-silicide layers (or the titanium mono-silicide layers) into the cobalt di-silicide layers (or the titanium di-silicide layers).

However, if the above salicide technique corresponds to a nickel salicide technique, the annealing process performed at the high temperature of 850–900° C. increases electrical resistance of nickel silicide layers formed on gate electrodes and source/drain regions of MOS transistors. Accordingly, the characteristics of the MOS transistors are degraded.

Further, methods of fabricating a semiconductor device having low hydrogen content and low physical stress are taught in U.S. Pat. No. 6,071,784 to Mehta et al. According to Mehta et al., an etching stop layer is formed on a semiconductor substrate including MOS transistors. The etching stop layer is subjected to a heat treatment at a temperature of 725–775° C. to decrease hydrogen content therein. As a result, it is possible to stabilize the threshold characteristic of the MOS transistors. However, in the event that the MOS transistors are fabricated using a nickel salicide technique, the heat treatment of the etching stop layer causes phase transformation of nickel silicide layers formed by the nickel salicide technique. This is due to the high annealing temperature of 725–775° C. Thus, switching operations of the MOS transistors may be degraded.

In conclusion, methods of fabricating a MOS transistor using a nickel salicide technique should be carefully optimized.

SUMMARY OF THE INVENTION

Embodiments of the invention provide methods of fabricating a semiconductor device including a MOS transistor.

In one aspect, the invention is directed to a method of fabricating a semiconductor device. A MOS transistor is formed in a predetermined region of a semiconductor substrate. The MOS transistor is formed to have a source region, a drain region and a gate electrode. The source region and the drain region are formed on the semiconductor substrate to be spaced apart from each other, and the gate electrode is formed to be located over a channel region between the source region and the drain region. A stress layer is formed on the semiconductor substrate having the MOS transistor. The stress layer is annealed to convert a physical stress of the stress layer into a tensile stress or to increase a tensile stress of the stress layer.

Accordingly, a compressive stress is applied to the source/drain regions that are in contact with the annealed stress layer. As a result, the channel region is converted into a strained channel having an increased lattice constant, since a tensile stress is applied to the channel region between the source region and the drain region.

In one embodiment, the MOS transistor is an NMOS transistor.

In one embodiment, a nickel silicide layer is formed on the gate electrode and/or the source/drain regions using a salicide technique prior to formation of the stress layer.

In one embodiment, the stress layer is formed of an insulating layer having a tensile stress.

In one embodiment, the insulating layer having the tensile stress is formed of at least one layer selected from the group consisting of a silicon nitride layer, a silicon oxynitride layer, an LPCVD oxide layer, an ALD oxide layer and an SOG layer. The silicon nitride layer and the silicon oxynitride layer can be formed using a plasma CVD technique or an ALD technique at a temperature below 500° C.

In one embodiment, the stress layer is formed to a thickenss of 50–2000 Å.

In one embodiment, annealing the stress layer is performed at a temperature of 400–550 Å. Annealing the stress layer can be performed using a nitrogen gas as an ambient gas.

In another aspect, the invention is directed to another method of fabricating a semiconductor device. The method includes forming an isolation layer at a semiconductor substrate to define an active region. A gate electrode is formed to cross over the active region. Spacers are formed on sidewalls of the gate electrode. N-type impurity ions are implanted into the active region using the gate electrode and the spacers as ion implantation masks to form an N-type source region and an N-type drain region at both sides of the gate electrode. A nickel silicide layer is formed on the gate electrode, the source region and the drain region using a nickel salicide technique. A stress layer is formed on a surface of the semiconductor substrate having the nickel silicide layer. The stress layer is annealed to convert its physical stress into a tensile stress or increase a tensile thereof. An interlayer insulating layer is then formed on the annealed stress layer.

In one embodiment, N-type impurity ions are implanted into the active region using the gate electrode and the isolation layer as ion implantation masks to form N-type LDD regions prior to formation of the spacers.

In one embodiment, the nickel silicide layer is a pure nickel silicide layer or a nickel alloy silicide layer. The nickel alloy silicide layer can contain at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb).

In one embodiment, the stress layer is formed of at least one layer selected from the group consisting of a silicon nitride layer, a silicon oxynitride layer, an LPCVD oxide layer, an ALD oxide layer and an SOG layer. The silicon nitride layer and the silicon oxynitride layer can be formed at a temperature below 500° C. using a plasma CVD technique or an ALD technique.

The stress layer can be formed to a thickness of 50–2000 Å.

Annealing the stress layer can be performed at a temperature of 400–550° C. Annealing the stress layer can be performed using a nitrogen gas as an ambient gas.

In yet another aspect, the invention is directed to another method of fabricating a semiconductor device. The method includes forming an isolation layer at a predetermined region of a semiconductor substrate to define an active region. A gate electrode is formed to cross over the active region. Spacers are formed on sidewalls of the gate electrode. N-type impurity ions are implanted into the active region using the gate electrode and the spacers as ion implantation masks, thereby forming an N-type source region and an N-type drain region at both sides of the gate electrode. As a result, an NMOS transistor is formed at the semiconductor substrate. In addition, a PMOS transistor may be formed at another active region adjacent to the active region. Nickel suicide layers are formed on the gate electrodes and the source/drain regions of the NMOS and PMOS transistors using a salicide technique. A stress layer is formed on a surface of the semiconductor substrate having the nickel silicide layers, and a lower interlayer insulating layer is formed on the stress layer. The lower interlayer insulating layer is patterned to selectively expose the stress layer over the NMOS transistor region. That is, the lower interlayer insulating layer is patterned to cover the stress layer over the PMOS transistor region. The substrate having the patterned lower interlayer insulating layer is annealed to convert the physical stress of the exposed stress layer into a tensile stress or to increase the tensile stress of the exposed stress layer. As a result, the NMOS transistor has a strained channel. Then, an upper interlayer insulating layer is formed on an entire surface of the annealed substrate.

In one embodiment, N-type ions are implanted into the active region using the isolation layer and the gate electrode as ion implantation masks to form N-type LDD regions at both sides of the gate electrode, prior to formation of the spacers.

The nickel silicide layer can be a pure nickel silicide layer or a nickel alloy silicide layer. The nickel alloy silicide layer can contains at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb). The stress layer can be formed of at least one layer selected from the group consisting of a silicon nitride layer, a silicon oxynitride layer, an LPCVD oxide layer, an ALD oxide layer and an SOG layer.

The silicon nitride layer and the silicon oxynitride layer can be formed at a temperature below 500° C. using a plasma CVD technique or an ALD technique.

In one embodiment, the stress layer can be formed to a thickness of 50–2000 Å.

Annealing the exposed stress layer can be performed at a temperature of 400–550° C. Annealing the stress layer can be performed using a nitrogen gas as an ambient gas.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
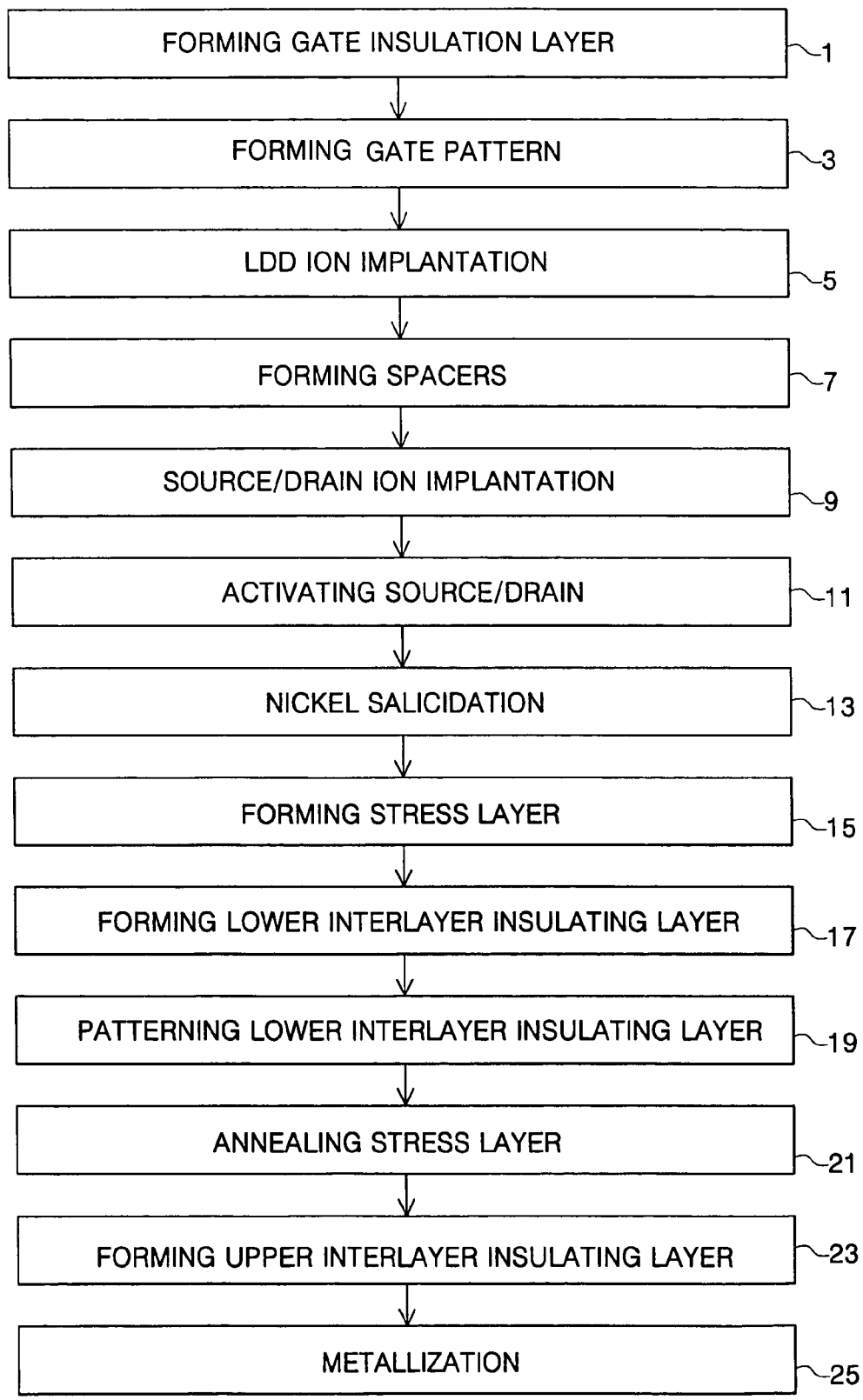
FIG. 1 is a process flow chart illustrating methods of fabricating a semiconductor device in accordance with embodiments of the present invention.

The present invention will now be described more fully hereinafter with reference to the accompanying drawings, in which exemplary embodiments of the invention are shown. In the drawings, the thickness of the layers and regions are exaggerated for clarity.

FIG. 1 is a process flow chart showing methods of fabricating a semiconductor device in accordance with embodiments of the present invention, and FIGS. 2 to 7 are cross-sectional views illustrating methods of fabricating a semiconductor device according to embodiments of the invention.

Figure 2:
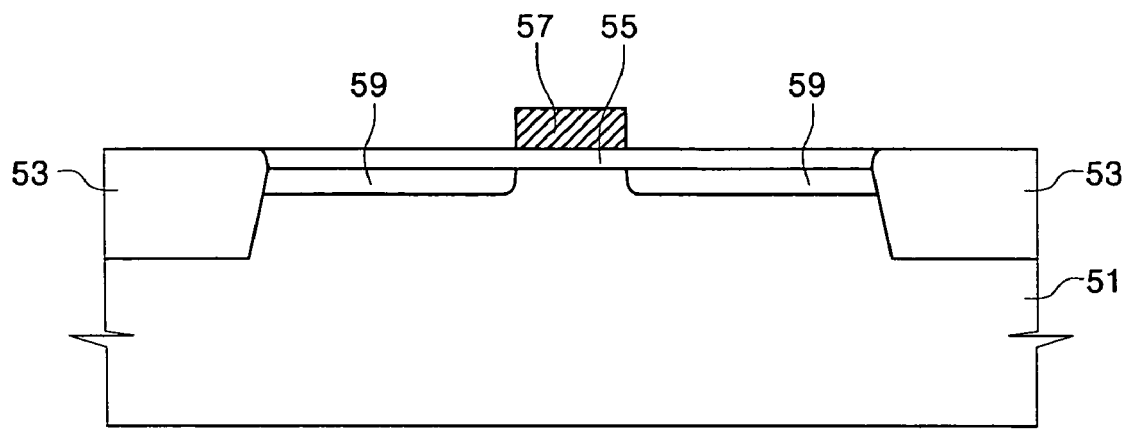
FIGS. 2 to 7 are cross-sectional views illustrating methods of fabricating a semiconductor device in accordance with embodiments of the present invention.

Referring to FIGS. 1 and 2, an isolation layer 53 is formed at a predetermined region of a semiconductor substrate 51 to define an active region. A gate insulation layer 55 is formed on the active region (Step 1 of FIG. 1). A gate conductive layer is formed on an entire surface of the semiconductor substrate having the gate insulation layer 55. The gate conductive layer may be formed of a silicon layer doped with N-type impurities. The gate conductive layer is patterned to form a gate pattern 57 (i.e., a gate electrode) on a predetermined region of the gate insulation layer 55 (Step 3 of FIG. 1). The gate pattern 57 is formed to cross over the active region. First impurity ions are implanted into the active region using the gate pattern 57 and the isolation layer 53 as ion implantation masks to form lightly doped drain (LDD) regions 59 (Step 5 of FIG. 1). The first impurity ions may be N-type impurity ions such as arsenic ions or phosphorus ions.

Figure 3:
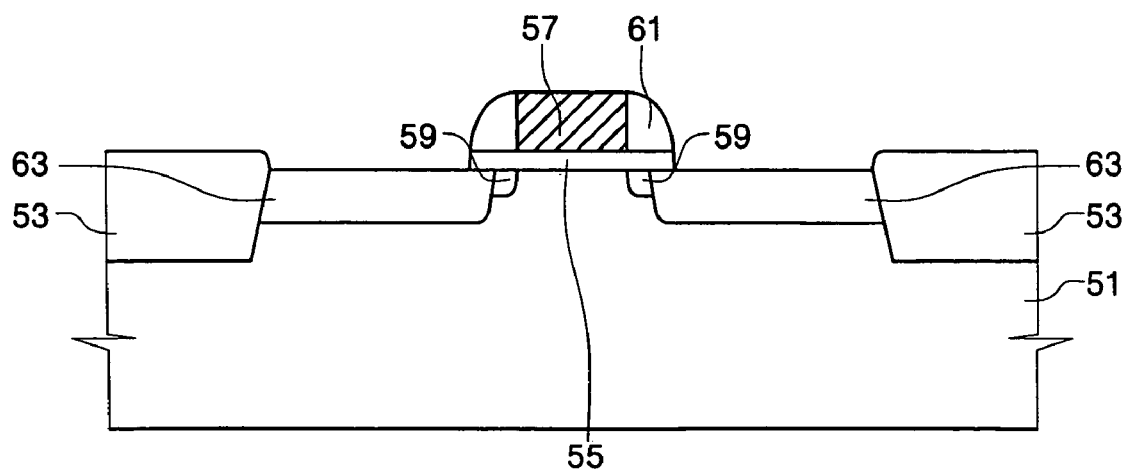

Referring to FIGS. 1 and 3, an insulating spacer layer is formed on the semiconductor substrate having the LDD regions 59. The spacer layer may be formed of a silicon oxide layer, a silicon nitride layer or a combination layer thereof. The spacer layer is unisotropically etched to form spacers 61 on sidewalls of the gate pattern 57 (Step 7 of FIG. 1). Second impurity ions are then implanted into the active region using the gate pattern 57, the spacers 61 and the isolation layer 53 as ion implantation masks, thereby forming source/drain regions 63 (Step 9 of FIG. 1). As a result, the LDD regions 59 remain beneath the spacers 61. The first impurity ions are the same conductivity type as the second impurity ions. That is, in the event that the first impurity ions are N-type impurity ions, the second impurity ions are also N-type impurity ions. The second impurity ions in the source/drain regions 63 are then annealed to form activated source/drain regions (Step 11 of FIG. 1). The annealing process of the second impurity ions may be performed using a rapid thermal process (RTP) at a temperature of about 830–1150° C. The gate electrode 57 and the source/drain regions 63 constitute a MOS transistor. In the event that the source/drain regions 63 are N-type, the MOS transistor is an NMOS transistor.

Figure 4:
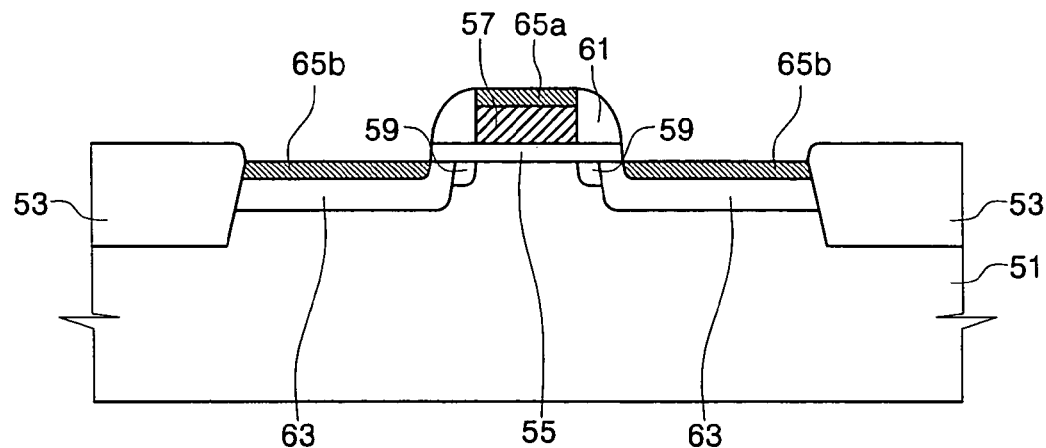

Referring to FIGS. 1 and 4, a salicide process, e.g., a nickel salicide process, is applied to the semiconductor substrate having the activated source/drain regions (Step 13 of FIG. 1). In more detail, the semiconductor substrate having the activated source/drain regions 63 is cleaned to remove a native oxide layer and contaminated particles on the surfaces of the gate pattern 57 and the activated source/drain regions 63, and a nickel layer is formed on the cleaned semiconductor substrate. The nickel layer may be formed of a pure nickel layer or a nickel alloy layer. The nickel alloy layer may contain at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb).

Subsequently, the semiconductor substrate having the nickel layer is annealed at a temperature of about 350–550° C. As a result, the nickel layer reacts with silicon atoms in the gate pattern 57 and the source/drain regions 63, thereby forming a first nickel mono-silicide (NiSi) layer 65a and second nickel mono-silicide (NiSi) layers 65b on the gate pattern 57 and the source/drain regions 63, respectively. If the silicidation temperature is higher than 550° C., nickel di-silicide ($NiSi_2$) layers having high resistance are formed instead of the nickel mono-silicide (NiSi) layers. Accordingly, the annealing process, e.g., the silicidation process, is preferably performed at a low temperature within the range of about 350–550° C. Unreacted nickel layers on the spacers 61 and the isolation layer 53 are then removed to electrically disconnect the first nickel mono-silicide layer 65a from the second nickel mono-silicide layers 65b. The unreacted nickel layers may be removed using a mixture of sulfuric acid ($H_2SO_4$) solution and hydrogen peroxide ($H_2O_2$) solution.

Figure 5:
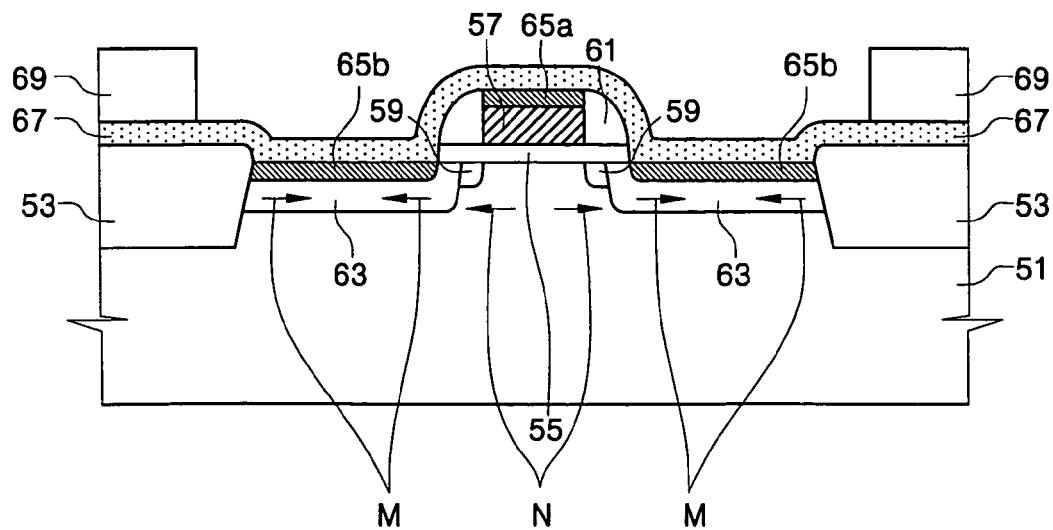

Referring to FIGS. 1 and 5, a stress layer 67 is formed on the semiconductor substrate where the unreacted nickel layers are removed (Step 15 of FIG. 1). The stress layer 67 may be formed of at least one layer selected from the group consisting of a silicon nitride (SiN) layer, a silicon oxynitride (SiON) layer, a low pressure chemical vapor deposition (LPCVD) oxide layer, an atomic layer deposition (ALD) oxide layer and a spin on glass (SOG) layer. In this case, the stress layer 67 is preferably formed to a thickness of about 50–2000 Å. In addition, the stress layer 67 is preferably formed at a temperature lower than 550° C. to prevent phase transformation of the nickel mono-silicide layers 65a and 65b. Accordingly, the silicon nitride layer or the silicon oxynitride layer is preferably formed using a plasma CVD process or an ALD process at a low temperature below 550° C. Also, the LPCVD oxide layer is preferably formed using a low temperature oxide (LTO) layer.

Subsequently, a lower interlayer insulating layer 69 is formed on the stress layer 67 (Step 17 of FIG. 1). The lower interlayer insulating layer 69 may be formed of a silicon oxide layer.

In the meantime, if both a PMOS transistor and a NMOS transistor are formed at the semiconductor substrate 51, the lower interlayer insulating layer 69 is preferably patterned to selectively expose the stress layer 67 in the NMOS transistor region (Step 19 of FIG. 1). In this case, the stress layer 67 in the PMOS transistor region is preferably covered with the patterned lower interlayer insulating layer 69.

The semiconductor substrate having the patterned lower interlayer insulating layer 69 is annealed to convert a physical stress of the exposed stress layer 67 into a tensile stress or to increase a tensile stress of the exposed stress layer 67 (Step 21 of FIG. 1)., For example, in the event that the initial stress layer 67 has a weak tensile stress, the annealing process enhances the weak tensile stress of the initial stress layer 67. In this case, a strong compressive stress is applied to the source/drain regions 63 that are in contact with the stress layer 67, as indicated by the arrows "M" of FIG. 5. As a result, a tensile stress is relatively applied to the channel region between the source/drain regions 63, as represented by the arrow "N" of FIG. 5. That is, the channel region is converted to a strained channel, thereby to have an increased lattice constant. Thus, when an inversion channel is formed in the channel region, mobility of carriers (for example, free electrons) in the inversion channel is increased to improve the switching characteristic of the MOS transistor.

Also, the annealing process of the stress layer 67 is preferably performed at a temperature within the range of about 400–550° C. to prevent phase transformation of the nickel mono-silicide layers 65a and 65b. The annealing process of the stress layer 67 may be performed using a nitrogen gas as an ambient gas.

Figure 6:
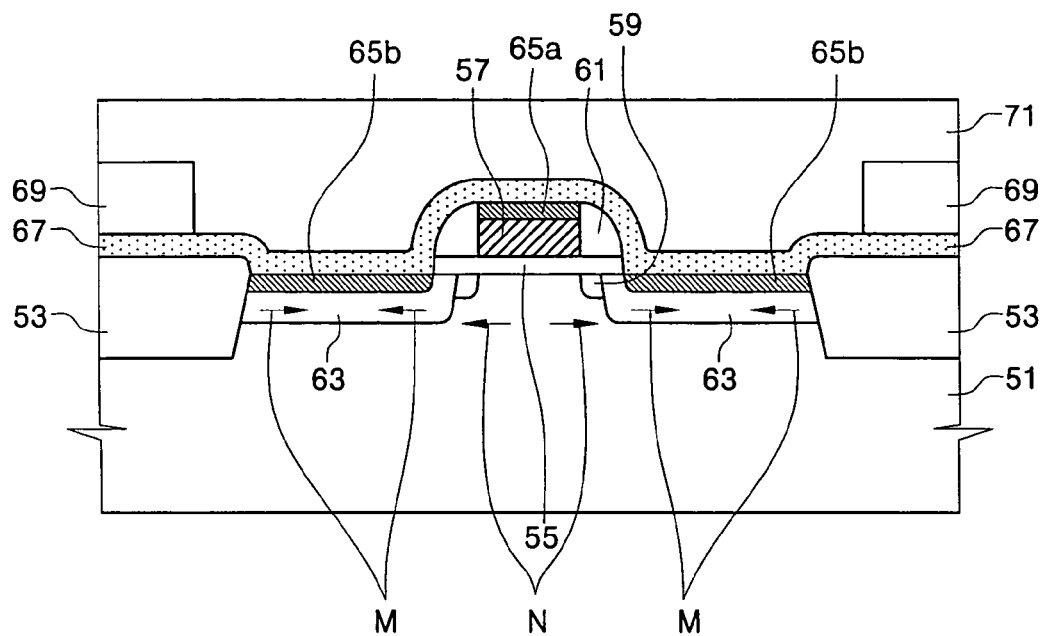

Referring to FIGS. 1 and 6, an upper interlayer insulating layer 71 is formed on an entire surface of the semiconductor substrate having the annealed stress layer 67 (Step 23 of FIG. 1). The upper interlayer insulating layer 71 may be formed of the same material as the lower interlayer insulating layer 69. The upper interlayer insulating layer 71 may be planarized using a planarization technique such as a chemical mechanical polishing (CMP) process.

In the event that only NMOS transistors are formed at the semiconductor substrate 51, the process for forming the lower interlayer insulating layer 69 may be skipped.

Figure 7:
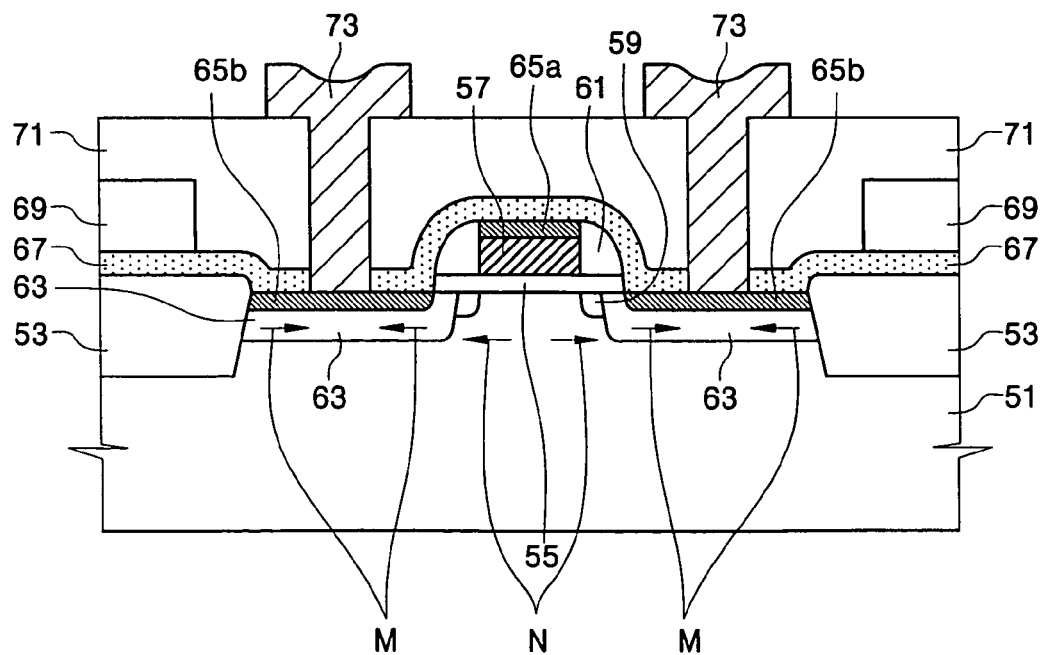

Referring to FIGS. 1 and 7, the interlayer insulating layers 69 and 71 and the annealed stress layer 67 are patterned to form contact holes that expose the second nickel mono-silicide layers 65b. The first nickel mono-silicide layer 65a may also be exposed during the formation of the contact holes. In the event that the stress layer 67 is formed of a silicon nitride layer or a silicon oxynitride layer, the stress layer 67 may act as an etching stop layer during the formation of the contact hole. A metal layer is formed on the semiconductor substrate having the contact holes, and the metal layer is patterned to form metal interconnection lines 73 that cover the contact holes.

EXAMPLES

Various measurement results of the samples fabricated according to the embodiments will be described hereinafter.

Figure 8:
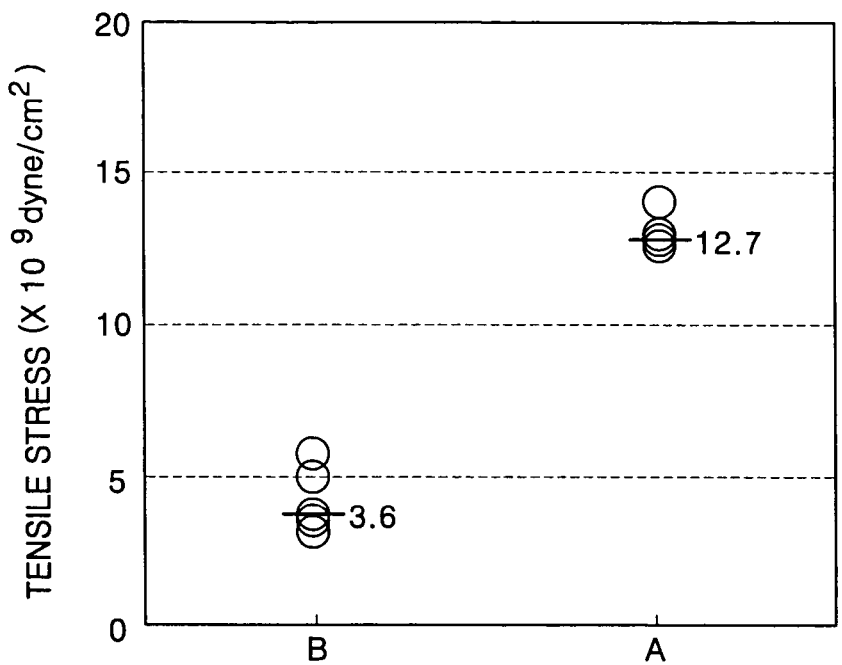
FIG. 8 is a graph showing characteristics of a stress layer used in the present invention.

FIG. 8 is a graph showing characteristics of stress layers employed in the present invention. In FIG. 8, the abscissa denotes sample groups "A" and "B", and the ordinate represents tensile stress of the sample groups "A" and "B". Here, the group "A" indicates pre-annealing samples, and the group "B" indicates post-annealing samples. The stress layers were formed of silicon oxynitride layers on bare silicon wafers and the silicon oxynitride layers were formed to a thickness of 1000 Å. Also, the silicon oxynitride layers were formed at a temperature of 400° C. using a plasma CVD technique. The silicon oxynitride layers of the group "B" were annealed at a temperature of 850° C. for 30 seconds using an oxygen gas as an ambient gas.

Referring to FIG. 8, the initial silicon oxynitride layers that belong to the sample group "A" exhibited a tensile stress of about $3.6 \times 10^9$ dyne/cm$^2$, and the annealed silicon oxynitride layers that belong to the sample group "B" exhibited a tensile stress of about $12.7 \times 10^9$ dyne/cm$^2$. As a result, the silicon oxynitride layers showed a proper characteristic to the stress layer used in the present invention.

Figure 9:
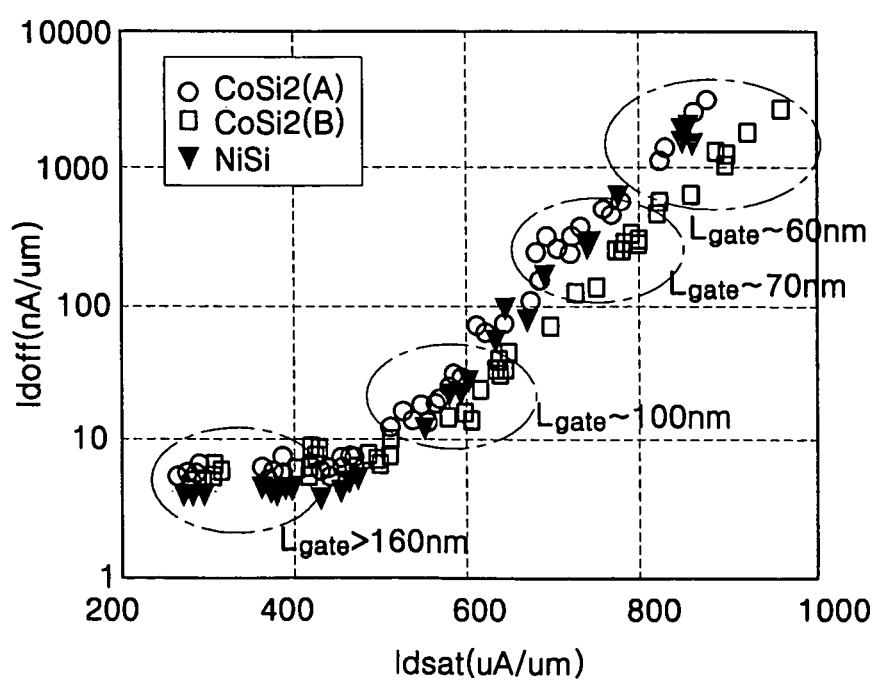
FIG. 9 is a graph showing on/off current characteristics of various NMOS transistors fabricated in accordance with embodiments of the present invention.

FIG. 9 is a graph showing on/off current characteristics (i.e., correlations of on current and off current) of NMOS transistors fabricated using a cobalt salicide technique and a nickel salicide technique. In FIG. 9, the abscissa indicates drain saturation current $I_{dsat}$ per unit channel width, and ordinate indicates drain off current $I_{doff}$ per unit channel width. The drain saturation current $I_{dsat}$ is a current that flows through the drain region when the source region and the bulk region are grounded and a power supply voltage $V_{dd}$ of +1V is applied to the drain region and the gate electrode. The drain off current $I_{doff}$ is a current that flows through the drain region when the source region, the bulk region and the gate electrode are grounded and the power supply voltage $V_{dd}$ of +1V is applied to the drain region.

The NMOS transistors showing the measurement results of FIG. 9 were fabricated using the key process conditions described in the following table 1.

TABLE 1

| Process Parameters | silicide layers | | |
|---|---|---|---|
| | CoSi$_2$ samples B | CoSi$_2$ samples A | NiSi samples |
| gate insulation layer | silicon oxynitride layer (SiON), 16 Å | | |
| gate electrode | N-type polysilicon layer | | |
| LDD ion implantation | Arsenic, $2.5 \times 10^{14}$ atoms/cm$^2$, 5 KeV | | |
| source/drain ion implantation | Arsenic, $5 \times 10^{15}$ atoms/cm$^2$, 40 KeV | | |
| source/drain activation | 1050° C., in nitrogen gas, rapid thermal process (RTP) | | |
| Salicidation | first anneal (450° C.) second anneal (830° C.) | | 450° C. |
| stress layer | Silicon oxynitride (SiON), 500 Å, plasma CVD, 400° C. | | |
| Annealing of stress layer | 850° C. | | skipped |

Referring to FIG. 9, the cobalt silicide samples B exhibited relatively large drain saturation current as compared to the cobalt silicide samples A. For example, in NMOS transistors having a channel length of 60 nm, the cobalt silicide samples "B" showed the drain saturation current $I_{dsat}$ of about 900 µA/µm and the cobalt silicide samples "A" showed the drain saturation current $I_{dsat}$ of about 800 µA/µm when the drain off current $I_{doff}$ was 1000 nA/µm. Therefore, it can be understood that the cobalt silicide samples B have strained channels due to the annealing process of the stress layer.

The nickel mono-silicide (NiSi) samples exhibited the same on/off current characteristics as the cobalt silicide samples "A". It can be understood that this is because the nickel mono-silicide samples and the cobalt silicide samples "A" are fabricated without the annealing process of the stress layers.

Figure 10:
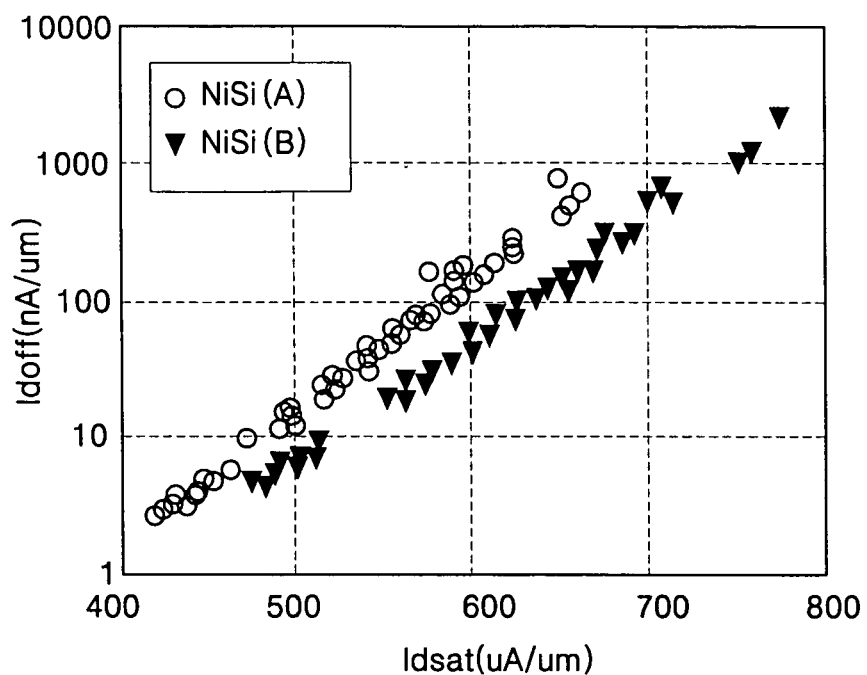
FIG. 10 is a graph showing on/off current characteristics of conventional NMOS transistors and on/off current characteristics of NMOS transistors fabricated in accordance with embodiments of the present invention.

FIG. 10 is a graph illustrating on/off current characteristics of NMOS transistors fabricated using a nickel salicide technique. In FIG. 10, the abscissa represents a drain saturation current $I_{dsat}$ per unit channel width and the ordinate represents a drain off current $I_{doff}$ per unit channel width. The drain saturation current $I_{dsat}$ and the drain off current $I_{doff}$ were measured under the same bias conditions as described with reference to FIG. 9.

NMOS transistors showing the measurement results of FIG. 10 were fabricated using the key process conditions described in the following table 2.

TABLE 2

| Process Parameters | silicide layers | |
|---|---|---|
| | NiSi samples A | NiSi samples B |
| Gate insulation layer | silicon oxynitride layer (SiON), 16 Å | |
| gate electrode | N-type polysilicon layer | |
| LDD ion implantation | Arsenic, $2.5 \times 10^{14}$ atoms/cm$^2$, 5 KeV | |
| source/drain ion implantation | Arsenic, $5 \times 10^{15}$ atoms/cm$^2$, 40 KeV | |
| source/drain activation | 1050° C., in nitrogen gas, RTP | |
| Salicidation | 450° C. | |
| stress layer | Silicon oxynitride layer (SiON), 500 Å, plasma CVD, 400° C. | |
| Annealing of stress layer | Skipped | 450° C., 30 min., in nitrogen gas |

Referring to FIG. 10, drain saturation current $I_{dsat}$ of the nickel suicide samples B was smaller than that of the nickel silicide samples A. For example, when the drain off current $I_{doff}$ was 100 nA/μm, the nickel silicide samples A showed the drain saturation current $I_{dsat}$ of about 590 μA/μm and the nickel silicide samples B showed the drain saturation current $I_{dsat}$ of about 620 μA/μm. Therefore, it can be understood that the nickel silicide samples B have strained channels due to the annealing process of the stress layers.

Figure 11:
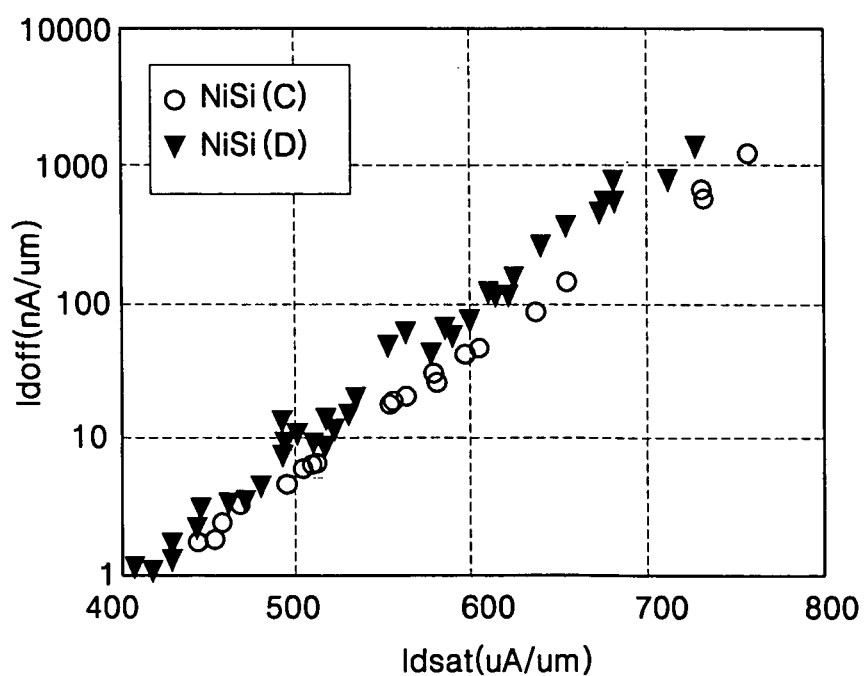
FIG. 11 is a graph showing on/off current characteristics of NMOS transistors fabricated using a material layer having a compressive stress and on/off current characteristics of conventional NMOS transistors.

FIG. 11 is a graph illustrating on/off current characteristics of NMOS transistors fabricated using a plasma CVD oxide layer as the stress layer. In FIG. 11, the abscissa represents a drain saturation current $I_{dsat}$ per unit channel width and the ordinate represents a drain off current $I_{doff}$ per unit channel width. The drain saturation current $I_{dsat}$ and the drain off current $I_{doff}$ were measured under the same bias conditions as described with reference to FIG. 9.

The NMOS transistors showing the measurement results of FIG. 11 were fabricated using the key process conditions described in the following table 3.

TABLE 3

| Process Parameters | silicide layers | |
|---|---|---|
| | NiSi samples C | NiSi samples D |
| gate insulation layer | silicon oxynitride layer (SiON), 16 Å | |
| gate electrode | N-type polysilicon layer | |
| LDD ion implantation | Arsenic, $2.5 \times 10^{14}$ atoms/cm$^2$, 5 KeV | |
| source/drain ion implantation | Arsenic, $5 \times 10^{15}$ atoms/cm$^2$, 40 KeV | |
| source/drain activation | 1050° C., in nitrogen gas, RTP | |
| Silicidation | 450° C. | |
| stress layer | silicon oxide (SiO$_2$), 500 Å, plasma CVD, 400° C. | |
| Annealing of stress layer | Skipped | 450° C., 30 min., in nitrogen gas |

Referring to FIG. 11, the drain saturation current $I_{dsat}$ of the NMOS transistors fabricated using the annealing process of the stress layer was smaller than that of the NMOS transistors fabricated without the annealing process of the stress layer. That is, the drain saturation current $I_{dsat}$ of the nickel silicide samples D was smaller than that of the nickel silicide samples C. From the above measurement results, it can be understood that the plasma CVD oxide layer has a compressive stress. In conclusion, the plasma CVD oxide layer formed at a temperature of 400° C. is not suitable for the stress layer of the NMOS transistors.

Figure 12:
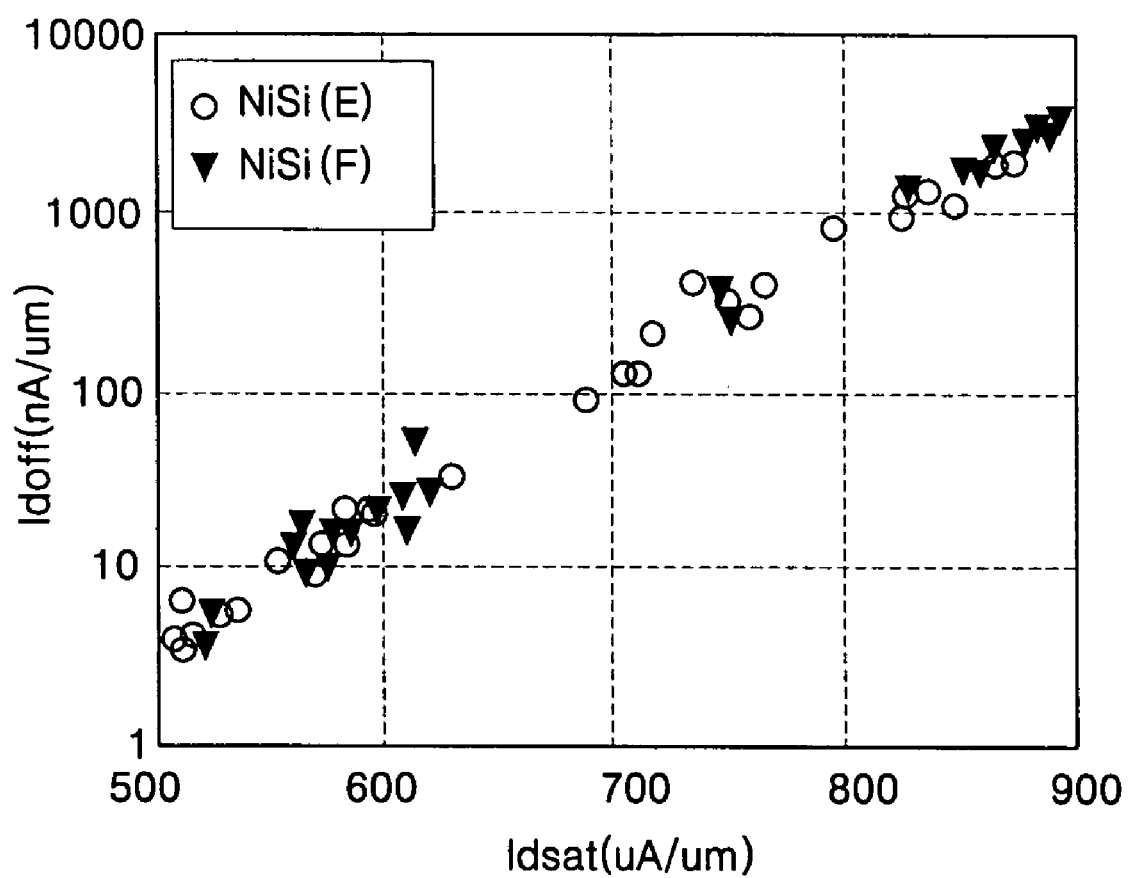
FIG. 12 is a graph showing on/off current characteristics of NMOS transistors that an annealing process is applied after sequentially forming a stress layer and an interlayer dielectric (ILD) layer.

FIG. 12 is a graph illustrating on/off current characteristics of NMOS transistors annealed after sequentially forming a stress layer and an interlayer insulating layer and on/off current characteristics of NMOS transistors fabricated without the annealing process. In FIG. 12, the abscissa represents a drain saturation current $I_{dsat}$ per unit channel width and the ordinate represents a drain off current $I_{doff}$ per unit channel width. The drain saturation current $I_{dsat}$ and the drain off current $I_{doff}$ were measured under the same bias conditions as described with reference to FIG. 9.

The NMOS transistors showing the measurement results of FIG. 12 were fabricated using the key process conditions described in the following table 4.

TABLE 4

| Process Parameters | NiSi samples E | NiSi samples F |
|---|---|---|
| Gate insulation layer | silicon oxynitride layer (SiON), 16 Å | |
| gate electrode | N-type polysilicon layer | |
| LDD ion implantation | Arsenic, $2.5 \times 10^{14}$ atoms/cm$^2$, 5 KeV | |
| source/drain ion implantation | Arsenic, $5 \times 10^{15}$ atoms/cm$^2$, 40 KeV | |
| source/drain activation | 1050° C., in nitrogen gas, RTP | |
| Salicidation | 450° C. | |
| Stress layer | SiON, 500 Å, plasma CVD, 400° C. | |
| interlayer insulating layer | low temperature oxide (LTO) layer, 5000 Å | |
| Annealing of stress layer | Skipped | 450° C., 30 min., in nitrogen gas |

Referring to FIG. 12, even though the annealing process was performed after sequentially forming the stress layer and the interlayer insulating layer, the drain saturation current $I_{dsat}$ of the annealed NMOS transistors was not increased. Therefore, it can be understood that a physical stress of the stress layer does not change if the annealing process is performed after formation of the interlayer insulating layer. Accordingly, to achieve the feature of the present invention, the annealing process of the stress layer should be performed after exposing the stress layer or before forming the interlayer insulating layer in order to obtain the strained channel.

In conclusion, when an annealing process is performed after formation of the stress layer, a MOS transistor with a strained channel can be realized.

As discussed above, MOS transistors with strained channels can be achieved by forming an insulating layer having a tensile stress on the MOS transistor and annealing the insulating layer. Accordingly, the switching speed of the MOS transistors can be improved.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    forming a MOS transistor at a predetermined region of a semiconductor substrate, the MOS transistor being formed to have a source region and a drain region spaced apart from each other as well as a gate electrode located over a channel region between the source and drain regions;
    forming a stress layer on the source region, the drain region and the gate electrode; and after forming the stress layer, annealing the stress layer on the source region, the drain region and the gate electrode to convert a physical stress of the stress layer into a tensile stress or increase a tensile stress of the stress layer.

2. The method according to claim 1, wherein the MOS transistor is an NMOS transistor.

3. The method according to claim 1, further comprising forming a nickel silicide layer on the gate electrode and/or the source and drain regions using a salicide technique prior to formation of the stress layer.

4. The method according to claim 1, wherein the stress layer is formed of an insulating layer having a tensile stress.

5. The method according to claim 4, wherein the insulating layer having the tensile stress is formed of at least one layer selected from the group consisting of a silicon nitride layer, a silicon oxynitride layer, an LPCVD oxide layer, an ALD oxide layer and an SOG layer.

6. The method according to claim 5, wherein the silicon nitride layer and the silicon oxynitride layer are formed using a plasma CVD technique or an ALD technique at a temperature below 500° C.

7. The method according to claim 1, wherein the stress layer is formed to a thickness of 50–2000 Å.

8. The method according to claim 1, wherein annealing the stress layer is performed at a temperature of 400–550 Å.

9. The method according to claim 8, wherein annealing the stress layer is performed using a nitrogen gas as an ambient gas.

10. A method of fabricating a semiconductor device, comprising:
   forming an isolation layer at a predetermined region of a semiconductor substrate to define an active region;
   forming a gate electrode crossing over the active region;
   forming spacers on sidewalls of the gate electrode;
   implanting N-type impurity ions into the active region using the gate electrode and the spacers as ion implantation masks to form an N-type source region and an N-type drain region at both sides of the gate electrode;
   forming a nickel silicide layer on the gate electrode and the source and drain regions using a salicide technique;
   forming a stress layer on the nickel silicide layer over the gate electrode and the source and drain regions;
   after forming the stress layer, annealing the stress layer over the gate electrode and the source and drain regions to convert a physical stress of the stress layer into a tensile stress or increase a tensile stress of the stress layer; and
   forming an interlayer insulating layer on the annealed stress layer.

11. The method according to claim 10, further comprising implanting N-type impurity ions into the active region using the gate electrode and the isolation layer as ion implantation masks to form N-type LDD regions prior to formation of the spacers.

12. The method according to claim 10, wherein the nickel silicide layer is one of a pure nickel silicide layer and a nickel alloy silicide layer.

13. The method according to claim 12, wherein the nickel silicide layer is the nickel alloy silicide layer, the nickel alloy silicide layer containing at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb).

14. The method according to claim 10, wherein the stress layer is formed of at least one layer selected from the group consisting of a silicon nitride layer, a silicon oxynitride layer, an LPCVD oxide layer, an ALD oxide layer and an SOG layer.

15. The method according to claim 14, wherein the silicon nitride layer and the silicon oxynitride layer are formed at a temperature below 500° C. using a plasma CVD technique or an ALD technique.

16. The method according to claim 10, wherein the stress layer is formed to a thickness of 50–2000 Å.

17. The method according to claim 10, wherein annealing the stress layer is performed at a temperature of 400–550° C.

18. The method according to claim 17, wherein annealing the stress layer is performed using a nitrogen gas as an ambient gas.

19. A method of fabricating a semiconductor device, comprising:
   forming an isolation layer at a predetermined region of a semiconductor substrate to define an active region;
   forming a gate electrode crossing over the active region;
   forming spacers on sidewalls of the gate electrode;
   implanting N-type impurity ions into the active region using the gate electrode and the spacers as ion implantation masks to form an N-type source region and an N-type drain region at both sides of the gate electrode;
   forming a nickel silicide layer on the gate electrode and the source/drain regions using a salicide technique;
   forming a stress layer on the semiconductor substrate including the nickel silicide layer; forming a lower interlayer insulating layer on the stress layer;
   patterning the lower interlayer insulating layer to selectively expose the stress layer over the active region;
   after patterning the lower insulating layer, annealing the exposed stress layer to convert a physical stress of the exposed stress layer into a tensile stress or increase a tensile stress of the exposed stress layer; and
   forming an upper interlayer insulating layer on the semiconductor substrate having the annealed stress layer.

20. The method according to claim 19, further comprising implanting N-type ions into the active region using the isolation layer and the gate electrode as ion implantation masks to form N-type LDD regions at both sides of the gate electrode, prior to formation of the spacers.

21. The method according to claim 19, wherein the nickel silicide layer is one of a pure nickel suicide layer and a nickel alloy silicide layer.

22. The method according to claim 21, wherein the nickel silicide layer is the nickel alloy suicide layer, the nickel alloy silicide layer containing at least one material selected from the group consisting of tantalum (Ta), zirconium (Zr), titanium (Ti), hafnium (Hf), tungsten (W), cobalt (Co), platinum (Pt), molybdenum (Mo), palladium (Pd), vanadium (V) and niobium (Nb).

23. The method according to claim 19, wherein the stress layer is formed of at least one layer selected from the group consisting of a silicon nitride layer, a silicon oxynitride layer, an LPCVD oxide layer, an ALD oxide layer and an SOG layer.

24. The method according to claim 23, wherein the silicon nitride layer and the silicon oxynitride layer are formed at a temperature below 500° C. using a plasma CVD technique or an ALD technique.

25. The method according to claim 19, wherein the stress layer is formed to a thickness of 50–2000 Å.

26. The method according to claim 19, wherein annealing the exposed stress layer is performed at a temperature of 400–550° C.

27. The method according to claim 26, wherein annealing the stress layer is performed using a nitrogen gas as an ambient gas.

* * * * *

UNITED STATES PATENT AND TRADEMARK OFFICE
CERTIFICATE OF CORRECTION

| | | |
|---|---|---|
| PATENT NO. | : 7,084,061 B2 | Page 1 of 1 |
| APPLICATION NO. | : 10/799788 | |
| DATED | : August 1, 2006 | |
| INVENTOR(S) | : Sun et al. | |

It is certified that error appears in the above-identified patent and that said Letters Patent is hereby corrected as shown below:

In Claim 21, Column 12, Line 49, delete "suicide" and insert --silicide-- between "nickel" and "layer".

In Claim 22, Column 12, Line 52, delete "suicide" and insert --silicide-- between "alloy" and "layer".

Signed and Sealed this

Nineteenth Day of December, 2006

JON W. DUDAS
*Director of the United States Patent and Trademark Office*